(12) United States Patent
Cawthorne (10) Patent No.: US 7,449,891 B2
(45) Date of Patent: Nov. 11, 2008

(54) MANAGING SERVICE LIFE OF A BATTERY (75) Inventor: William R. Cawthorne, Milford, MI (US)

(73) Assignee: General Motors Corporation, Detroit, MI (US)

( * ) Notice: Subject to any disclaimer, the term of this patent is extended or adjusted under 35 U.S.C. 154(b) by 481 days.

(21) Appl. No.: 10/965,671

(22) Filed: Oct. 14, 2004

(65) Prior Publication Data

US 2005/0077877 A1    Apr. 14, 2005

Related U.S. Application Data

(60) Provisional application No. 60/511,456, filed on Oct. 14, 2003.

(51) Int. Cl.
*G01N 27/416* (2006.01)

(52) U.S. Cl. .................. 324/427; 320/132; 320/136

(58) Field of Classification Search .................. 320/427, 320/132, 136
See application file for complete search history.

(56) References Cited

U.S. PATENT DOCUMENTS

| | | | |
|---|---|---|---|
| 5,352,982 A * | 10/1994 | Nakazawa et al. | 324/427 |
| 5,761,072 A * | 6/1998 | Bardsley, Jr. et al. | 702/63 |
| 5,910,722 A | 6/1999 | Lyons et al. | |
| 6,362,602 B1 | 3/2002 | Kozarekar | |
| 6,449,537 B1 | 9/2002 | Phillips et al. | |
| 6,518,732 B2 | 2/2003 | Palanisamy | |
| 7,023,216 B2 * | 4/2006 | Prema et al. | 324/435 |
| 2002/0030494 A1 * | 3/2002 | Araki et al. | 324/427 |
| 2002/0171429 A1 * | 11/2002 | Ochiai et al. | 324/426 |
| 2004/0189255 A1 * | 9/2004 | Koch | 320/132 |

* cited by examiner

*Primary Examiner*—Adolf Berhane
*Assistant Examiner*—Samuel Berhanu (57) ABSTRACT

A hybrid electric vehicle has an energy storage system including one or more batteries. Battery service life is managed by establishing an amp-hour throughput budget and limiting battery current substantially to the budget.

13 Claims, 5 Drawing Sheets

MANAGING SERVICE LIFE OF A BATTERY

CROSS REFERENCE TO RELATED APPLICATIONS

This application claims priority to U.S. provisional patent application Ser. No. 60/511,456 filed on Oct. 14, 2003, and to U.S. patent application Ser. No. 10/779,531 filed on Feb. 14, 2004, both of which are hereby incorporated herein by reference in their entirety.

TECHNICAL FIELD

This invention is related to battery energy storage. More particularly, the invention in concerned with managing the service life of a battery.

BACKGROUND OF THE INVENTION

An HEV is a vehicle that has a propulsion system that consists of at least one electric motor or electric machine in combination with at least one other power source. Typically, the other power source is a gasoline or diesel engine. There are various types of HEVs depending on how the electric motor(s) and other power source(s) are combined with one another in order to provide propulsion for the vehicle, including series, parallel and compound HEVs.

Various hybrid powertrain architectures are known for managing the input and output torques of various propulsion systems in HEVs, most commonly internal combustion engines and electric machines. Series hybrid architectures are generally characterized by an internal combustion engine driving an electric generator which in turn provides electrical power to an electric drivetrain and to an energy storage system, comprising a battery pack. The internal combustion engine in a series HEV is not directly mechanically coupled to the drivetrain. The electric generator may also operate in a motoring mode to provide a starting function to the internal combustion engine, and the electric drivetrain may recapture vehicle braking energy by also operating in a generator mode to recharge the battery pack.

Parallel HEV architectures are generally characterized by an internal combustion engine and an electric motor which both have a direct mechanical coupling to the drivetrain. The drivetrain conventionally includes a shifting transmission to provide the necessary gear ratios for wide range operation.

Electrically variable transmissions (EVT) are known which provide for continuously variable speed ratios by combining features from both series and parallel HEV powertrain architectures. EVTs are operable with a direct mechanical path between an internal combustion engine and a final drive unit thus enabling high transmission efficiency and application of lower cost and less massive motor hardware. EVTs are also operable with engine operation mechanically independent from the final drive or in various mechanical/electrical split contributions (i.e., input split, output split and compound split configurations) thereby enabling high-torque continuously variable speed ratios, electrically dominated launches, regenerative braking, engine off idling, and two-mode operation.

Such complex EVT HEVs utilize one or more electric machines and require advanced energy storage systems (ESS) to supply electrical energy to and receive and store electrical energy from these machines. The ESS typically incorporates a battery pack and associated monitoring and control electronics and algorithms. Given the dynamics associated with operation of an HEV, particularly the constant flow of power into and out of the ESS, the ESS plays a critical role in the operation of these vehicles. The critical role of the ESS in these vehicles imposes a number of requirements on ESS performance, including both operational and service life requirements.

Significant attention has been given to maintaining the operational performance of batteries used as the ESS in HEV applications. Particular attention has been given to various aspects of maintaining the battery pack state of charge (SOC). The SOC is defined generally as the ratio of the residual charge in a battery relative to its full charge capacity. Various hardware and software control strategies have been adjusted for determining and maintaining the SOC of the battery.

While understanding and maintaining the SOC of the battery is critical to its performance in HEV applications, it is not the only important characteristic of the battery. Another critical characteristic of batteries used in HEV applications is the useful life of the battery or battery pack. For example, it is known that secondary batteries, such as Ni-MH batteries, have limited amp-hour throughput that defines their useful service life.

Therefore, since the battery has a limited life, in order for HEVs to compete with other propulsion technologies, it is desirable in some applications to utilize control strategies that will permit the service life of the battery to be managed to particular levels based upon the various parameters that effect battery life such as, amp-hour throughput, overvoltage/undervoltage and temperature.

SUMMARY OF THE INVENTION

The present invention is a method of managing the service life of a battery. The service life of a battery is expressed and represented in terms of the absolute cumulative battery amp-hour throughput and the service life of the battery can be correlated directly to this amp-hour throughput. A target service life is selected in terms of total operative service time. The absolute cumulative battery amp-hour throughput representing the service life of the battery is distributed across the service life target to establish an amp-hour per hour of service time budget.

A method for achieving a predetermined service life of a battery therefore includes monitoring current moving into and out of the battery and limiting current as necessary to an average value thereof that is related to the predetermined service life.

A method for limiting battery power includes providing an amp-hour threshold and monitoring amp-hour throughput of the battery. A moving average amp-hour throughput is determined. When the moving average amp-hour throughput exceeds said amp-hour threshold, a battery power limit as a function of the moving average amp-hour throughput is established. Battery power is then limited in accordance with the established battery power limit. Preferably, the moving average amp-hour throughput is determined by low pass filtering of the monitored amp-hour throughput. The battery power limit is preferably increasingly tightened as the moving average amp-hour throughput increasingly exceeds the threshold. High and low battery states of charge preferably result in battery power limit adjustments that allow for extended discharge and charge power, respectively.

A method for establishing limits on battery power includes determining battery current throughput and comparing battery current throughput to a predetermined threshold related to a battery life target. And, when the battery current throughput exceeds the threshold, a battery power limit effective to reduce the battery current throughput is provided. Preferably, the battery current throughput is calculated from a moving average of battery current magnitude. More particularly, such a moving average of battery current magnitude is determined by low pass filtering of the battery current magnitude with heavier weighting of the more recent battery current magnitudes. The battery life target is preferably a predetermined amount of operating time and the threshold corresponds to a battery current throughput budget which will result battery life at least to the battery life target. The battery power limit is preferably increasingly tightened as the battery current throughput increasingly exceeds the threshold. High and low battery states of charge preferably result in battery power limit adjustments that allow for extended discharge and charge power, respectively.

An article of manufacture includes program instructions for establishing limits on battery power and a computer readable medium that stores the code. The program instructions include code for determining battery current throughput, code for comparing battery current throughput to a predetermined threshold related to a battery life target, and code for providing a battery power limit effective to reduce the battery current throughput when the battery current throughput exceeds said threshold.

BRIEF DESCRIPTION OF THE DRAWINGS

The present invention will become more fully understood from the detailed description given here below, the appended claims, and the accompanying drawings in which:

DESCRIPTION OF THE PREFERRED EMBODIMENT

Figure 1:
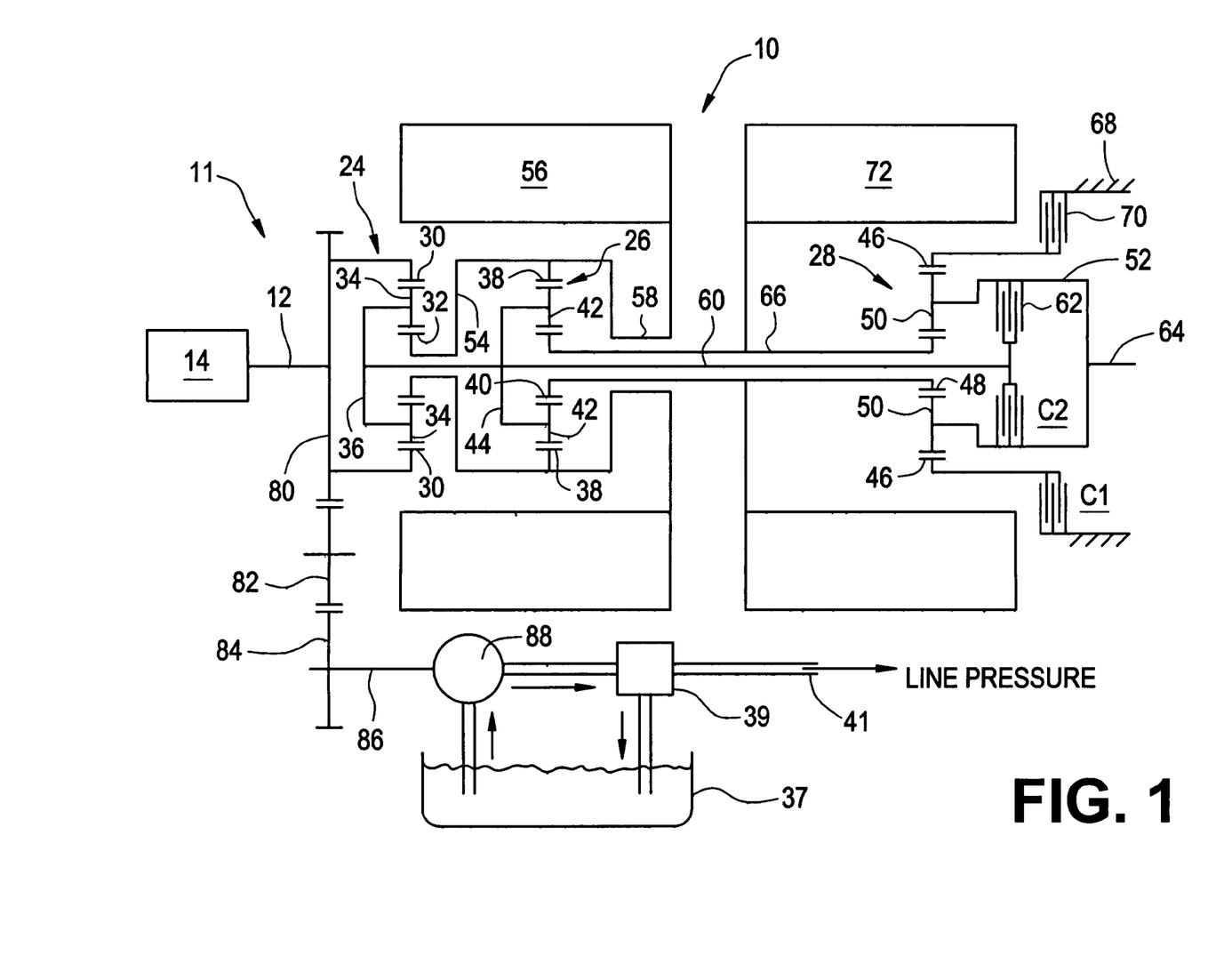
FIG. 1 is a mechanical hardware schematic representation of one preferred form of a two-mode, compound-split, electrically variable transmission particularly suited to the implementation of the present invention.
Figure 2:
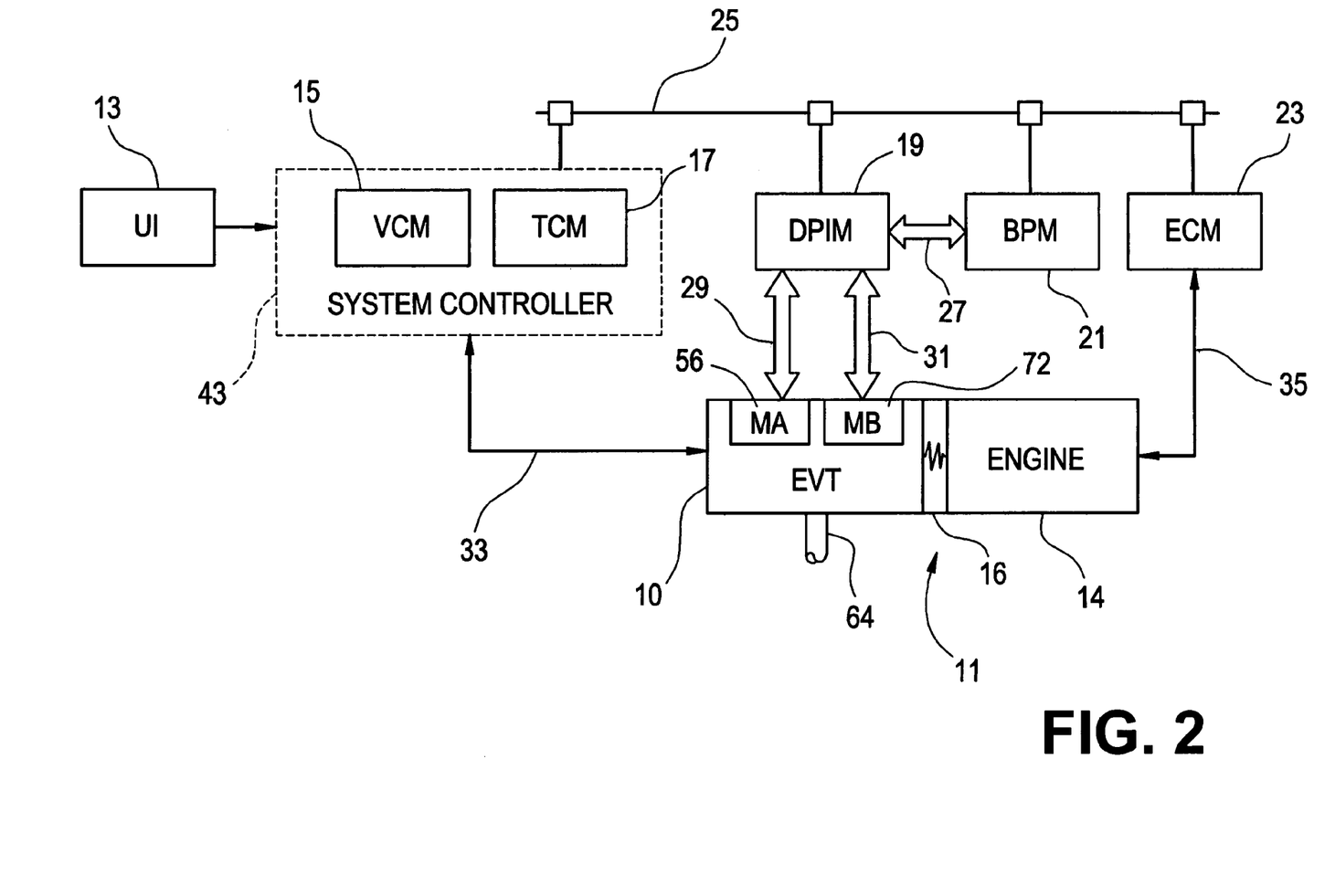
FIG. 2 is an electrical and mechanical schematic of a preferred system architecture for the hybrid powertrain disclosed herein.

With reference first to FIGS. 1 and 2, a vehicular powertrain is generally designated 11. Included in the powertrain 11 is one representative form of a multi-mode, compound-split, electrically variable transmission (EVT) particularly suited for implementing the controls of the present invention and designated generally by the numeral 10 in FIGS. 1 and 2. With particular reference, then, to those figures, the EVT 10 has an input member 12 that may be in the nature of a shaft which may be directly driven by an engine 14 or, as shown in FIG. 2, a transient torque damper 16 may be incorporated between the output member of the engine 14 and the input member of the EVT 10. The transient torque damper 16 may incorporate, or be employed in conjunction with, a torque transfer device (not shown) to permit selective engagement of the engine 14 with the EVT 10, but it must be understood that such a torque transfer device is not utilized to change, or control, the mode in which the EVT 10 operates.

In the embodiment depicted the engine 14 may be a fossil fuel engine, such as a diesel engine which is readily adapted to provide its available power output delivered at a constant number of revolutions per minute (RPM). In the exemplary embodiment to which FIGS. 1 and 2 are directed, the engine 14 can—after start-up, and during the majority of its input—operate at a constant speed or at a variety of constant speeds in accordance with a desired operating point as may be determined from operator inputs and driving conditions.

The EVT 10 utilizes three planetary gear subsets 24, 26 and 28. The first planetary gear subset 24 has an outer gear member 30, that may generally be designated as the ring gear, which circumscribes an inner gear member 32, generally designated as the sun gear. A plurality of planet gear members 34 are rotatably mounted on a carrier 36 such that each planet gear member 34 meshingly engages both the outer gear member 30 and the inner gear member 32.

The second planetary gear subset 26 also has an outer gear member 38, generally designated as the ring gear, which circumscribes an inner gear member 40, generally designated as the sun gear. A plurality of planet gear members 42 are rotatably mounted on a carrier 44 such that each planet gear 42 meshingly engages both the outer gear member 38 and the inner gear member 40.

The third planetary gear subset 28 also has an outer gear member 46, generally designated as the ring gear, which circumscribes an inner gear member 48, generally designated as the sun gear. A plurality of planet gear members 50 are rotatably mounted on a carrier 52 such that each planet gear 50 meshingly engages both the outer gear member 46 and the inner gear member 48.

While all three planetary gear subsets 24, 26 and 28 are "simple" planetary gear subsets in their own right, the first and second planetary gear subsets 24 and 26 are compounded in that the inner gear member 32 of the first planetary gear subset 24 is conjoined, as through a hub plate gear 54, to the outer gear member 38 of the second planetary gear subset 26. The conjoined inner gear member 32 of the first planetary gear subset 24 and the outer gear member 38 of the second planetary gear subset 26 are continuously connected to a first motor/generator 56, as by a sleeve shaft 58. First motor/generator 56 may also be referred to herein variously as motor A or $M_A$.

The planetary gear subsets 24 and 26 are further compounded in that the carrier 36 of the first planetary gear subset 24 is conjoined, as through a shaft 60, to the carrier 44 of the second planetary gear subset 26. As such, carriers 36 and 44 of the first and second planetary gear subsets 24 and 26, respectively, are conjoined. The shaft 60 is also selectively connected to the carrier 52 of the third planetary gear subset 28, as through a torque transfer device 62 which, as will be hereinafter more fully explained, is employed to assist in the selection of the operational modes of the EVT 10. Torque transfer device 62 may also be referred to herein variously as second clutch, clutch two or C2.

The carrier 32 of the third planetary gear subset 28 is connected directly to the transmission output member 64. When the EVT 10 is used in a land vehicle, the output member 64 may be connected to the vehicular axles (not shown) that may, in turn, terminate in the drive members (also not shown). The drive members may be either front or rear wheels of the vehicle on which they are employed, or they may be the drive gear of a track vehicle.

The inner gear member 40 of the second planetary gear subset 26 is connected to the inner gear member 48 of the third planetary gear subset 28, as through a sleeve shaft 66 that circumscribes shaft 60. The outer gear member 46 of the third planetary gear subset 28 is selectively connected to ground, represented by the transmission housing 68, through a torque transfer device 70. Torque transfer device 70, as is also hereinafter explained, is also employed to assist in the selection of the operational modes of the EVT 10. Torque transfer device 70 may also be referred to herein variously as first clutch, clutch one or C1.

The sleeve shaft 66 is also continuously connected to a second motor/generator 72. Second motor/generator 72 may also be referred to herein variously as motor B or $M_B$. All the planetary gear subsets 24, 26 and 28 as well as motor A and motor B (56, 72) are coaxially oriented, as about the axially disposed shaft 60. It should be noted that both motors A and B are of an annular configuration which permits them to circumscribe the three planetary gear subsets 24, 26 and 28 such that the planetary gear subsets 24, 26 and 28 are disposed radially inwardly of the motors A and B. This configuration assures that the overall envelope—i.e., the circumferential dimension—of the EVT 10 is minimized.

A drive gear 80 may be presented from the input member 12. As depicted, the drive gear 80 fixedly connects the input member 12 to the outer gear member 30 of the first planetary gear subset 24, and the drive gear 80, therefore, receives power from the engine 14 and/or the motor/generators 56 and/or 72. The drive gear 80 meshingly engages an idler gear 82 which, in turn, meshingly engages a transfer gear 84 that is secured to one end of a shaft 86. The other end of the shaft 86 may be secured to a transmission fluid pump and 88 which is supplied transmission fluid from sump 37, delivering high pressure fluid to regulator 39 which returns a portion of the fluid to sump 37 and provides regulated line pressure in line 41.

In the described exemplary mechanical arrangement, the output member 64 receives power through two distinct gear trains within the EVT 10. A first mode, or gear train, is selected when the first clutch C1 is actuated in order to "ground" the outer gear member 46 of the third planetary gear subset 28. A second mode, or gear train, is selected when the first clutch C1 is released and the second clutch C2 is simultaneously actuated to connect the shaft 60 to the carrier 52 of the third planetary gear subset 28.

Those skilled in the art will appreciate that the EVT 10 is capable of providing a range of output speeds from relatively slow to relatively fast within each mode of operation. This combination of two modes with a slow to fast output speed range in each mode allows the EVT 10 to propel a vehicle from a stationary condition to highway speeds. In addition, a fixed-ratio state wherein both clutches C1 and C2 are simultaneously applied is available for efficient mechanical coupling of the input member to the output member through a fixed gear ratio. Furthermore, a neutral state wherein both clutches C1 and C2 are simultaneously released is available for mechanically decoupling the output member from the transmission. Finally, the EVT 10 is capable to provide synchronized shifts between the modes wherein slip speed across both clutches C1 and C2 is substantially zero. Additional details regarding operation of the exemplary EVT can be found in commonly assigned U.S. Pat. No. 5,931,757, the contents of which are incorporated herein by reference.

Engine 14 is preferably a diesel engine and electronically controlled by engine control module (with the) 23 as illustrated in FIG. 2. ECM 23 is a conventional microprocessor based diesel engine controller comprising such common elements as microprocessor, read only memory ROM, random access memory RAM, electrically programmable read only memory EPROM, high speed clock, analog to digital (A/D) and digital to analog (D/A) circuitry, and input/output circuitry and devices (I/O) and appropriate signal conditioning and buffer circuitry. ECM 23 functions to acquire data from a variety of sensors and control a variety of actuators, respectively, of the engine 14 over a plurality of discrete lines. For simplicity, ECM 23 is shown generally in bi-directional interface with engine 14 via aggregate line 35. Among the various parameters that may be sensed by ECM 23 are oil sump and engine coolant temperatures, engine speed (Ne), turbo pressure, and ambient air temperature and pressure. Various actuators that may be controlled by the ECM 23 include fuel injectors, fan controllers, engine preheaters including glow plugs and grid-type intake air heaters. ECM preferably provides for well known torque based controls for engine 14 in response to a torque command Te_cmd provided by the EVT control system. Such engines electronics, controls and quantities are generally well known to those skilled in the art and further detailed exposition thereof is not required herein.

As should be apparent from the foregoing description the EVT 10 selectively receives power from the engine 14. As will now be explained with continued reference to FIG. 2, the EVT also receives power from an electric energy storage device such as one or more batteries in battery pack module (BPM) 21. As used herein, reference to a battery includes not only a single battery, also includes any combination of single or multiple batteries, or cells thereof, into a battery pack or array, or a plurality of battery packs or arrays. BPM 21 is preferably a parallel array of battery packs, each of which comprises a plurality of batteries. As used herein, the term battery generally refers to any secondary or rechargeable battery, but those comprising lead/acid, nickel/metal hydride, lithium/ion or polymer cells are preferred. Other electric energy storage devices that have the ability to store electric power through charging and dispense electric power through discharging, such as super capacitors or ultracapacitors, may be used in place of, or in combination with, the batteries without altering the concepts of the present invention. The BPM 21 is high voltage DC (e.g., about 650V in an exemplary embodiment) coupled to dual power inverter module (DPIM) 19 via DC lines 27. Current is transferable to or from the BPM 21 in accordance with whether the BPM 21 is being charged or discharged. BPM 21 also comprises a conventional microprocessor based controller comprising such common elements as microprocessor, read only memory ROM, random access memory RAM, electrically programmable read only memory EPROM, high speed clock, analog to digital (A/D) and digital to analog (D/A) circuitry, and input/output circuitry and devices (I/O), temperature sensors and appropriate signal conditioning and buffer circuitry necessary to monitor the state of the battery and transmit this information to other portions of the control system for use in the overall control of the vehicle, such as VCM 15 and TCM 17. This includes sensing, processing, calculating and otherwise monitoring various parametric information regarding the state or condition of the battery, such as its temperature, current and voltage while charging and discharging, and state of charge (SOC), which comprises the instantaneous amount of energy stored in the battery expressed as a percentage of its total energy storage capacity. This also includes transmitting the information concerning these parameters to other portions of the vehicle control system, including the VCM 15 and TCM 17, for use in conjunction with control algorithms which make use of battery parametric information, such as those used to establish SOC-related charge and discharge limits, amp-hour/hour or energy throughput limits, temperature limits or other battery-related control functions and limits.

DPIM 19 includes a pair of power inverters and respective motor controllers configured to receive motor control commands and control inverter states therefrom for providing motor drive or regeneration functionality. Motor controllers are microprocessor based controllers comprising such common elements as microprocessor, read only memory ROM, random access memory RAM, electrically programmable read only memory EPROM, high speed clock, analog to digital (A/D) and digital to analog (D/A) circuitry, and input/output circuitry and devices (I/O) and appropriate signal conditioning and buffer circuitry. In motoring control, the respective inverter receives current from the DC lines and provides AC current to the respective motor over high voltage phase lines 29 and 31. In regeneration control, the respective inverter receives AC current from the motor over high voltage phase lines 29 and 3 1 and provides current to the DC lines 27. The net DC current provided to or from the inverters determines the charge or discharge operating mode of the BPM 21. Preferably, $M_A$ and $M_B$ are three-phase AC machines and the inverters comprise complementary three-phase power electronics. Individual motor speed signals Na and Nb for $M_A$ and $M_B$, respectively, are also derived by the DPIM 19 from the motor phase information or conventional rotation sensors. Such motors, electronics, controls and quantities are generally well known to those skilled in the art and further detailed exposition thereof is not required herein.

System controller 43 is a microprocessor based controller comprising such common elements as microprocessor, read only memory ROM, random access memory RAM, electrically programmable read only memory EPROM, high speed clock, analog to digital (A/D) and digital to analog (D/A) circuitry, digital signal processor. (DSP), and input/output circuitry and devices (I/O) and appropriate signal conditioning and buffer circuitry. In the exemplary embodiment, system controller 43 comprises a pair of microprocessor based controllers designated as vehicle control module (VCM) 15 and transmission control module (TCM) 17. VCM and TCM may provide, for example, a variety of control and diagnostic functions related to EVT and vehicle chassis including, for example, engine torque commands, input speed control, and output torque control in coordination with regenerative braking, anti-lock braking and traction control. Particularly with respect to EVT functionality, system controller 43 functions to directly acquire data from a variety of sensors and directly control a variety of actuators, respectively, of the EVT over a plurality of discrete lines. For simplicity, system controller 43 is shown generally in bi-directional interface with EVT via aggregate line 33. Of particular note, system controller 43 receives frequency signals from rotation sensors for processing into input member 12 speed Ni and output member 64 speed No for use in the control of EVT 10. System controller 43 may also receive and process pressure signals from pressure switches (not separately illustrated) for monitoring clutch C1 and C2 application chamber pressures. Alternatively, pressure transducers for wide range pressure monitoring may be employed. PWM and/or binary control signals are provided by system controller to EVT 10 for controlling fill and drain of clutches C1 and C2 for application and release thereof. Additionally, system controller 43 may receive transmission fluid sump 37 temperature data, such as from conventional thermocouple input (not separately illustrated) to derive sump temperature Ts and provide a PWM signal which may be derived from input speed Ni and sump temperature Ts for control of line pressure via regulator 39. Fill and drain of clutches C1 and C2 are effectuated by way of solenoid controlled spool valves responsive to PWM and binary control signals as alluded to above. Similarly, line pressure regulator 39 may be of a solenoid controlled variety for establishing regulated line pressure in accordance with the described PWM signal. Such line pressure controls are generally well known to those skilled in the art. Clutch slip speeds across clutches C1 and C2 are derived from output speed No, $M_A$ speed Na and $M_B$ speed Nb; specifically, C1 slip is a function of No and Nb, whereas C2 slip is a function of No, Na and Nb. Also illustrated is user interface (UI) block 13 which comprises such inputs to system controller 43 such as vehicle throttle position, push button shift selector (PBSS) for available drive range selection, brake effort and fast idle requests among others. System controller 43 determines a torque command Te_cmd and provides it to ECM 23. Torque command Te_cmd is representative of the EVT torque contribution desired from the engine as determined by the system controller.

The various modules described (i.e., system controller 43, DPIM 19, BPM 21, ECM 23) communicate via controller area network (CAN) bus 25. The CAN bus 25 allows for communication of control parameters and commands between the various modules. The specific communication protocol utilized will be application specific. For example, the preferred protocol for heavy duty applications is the Society of Automotive Engineers standard J1939. The CAN bus and appropriate protocols provide for robust messaging and multi-controller interfacing between the system controller, ECM, DPIM, BPIM and other controllers such as antilock brake and traction controllers.

Figure 3:
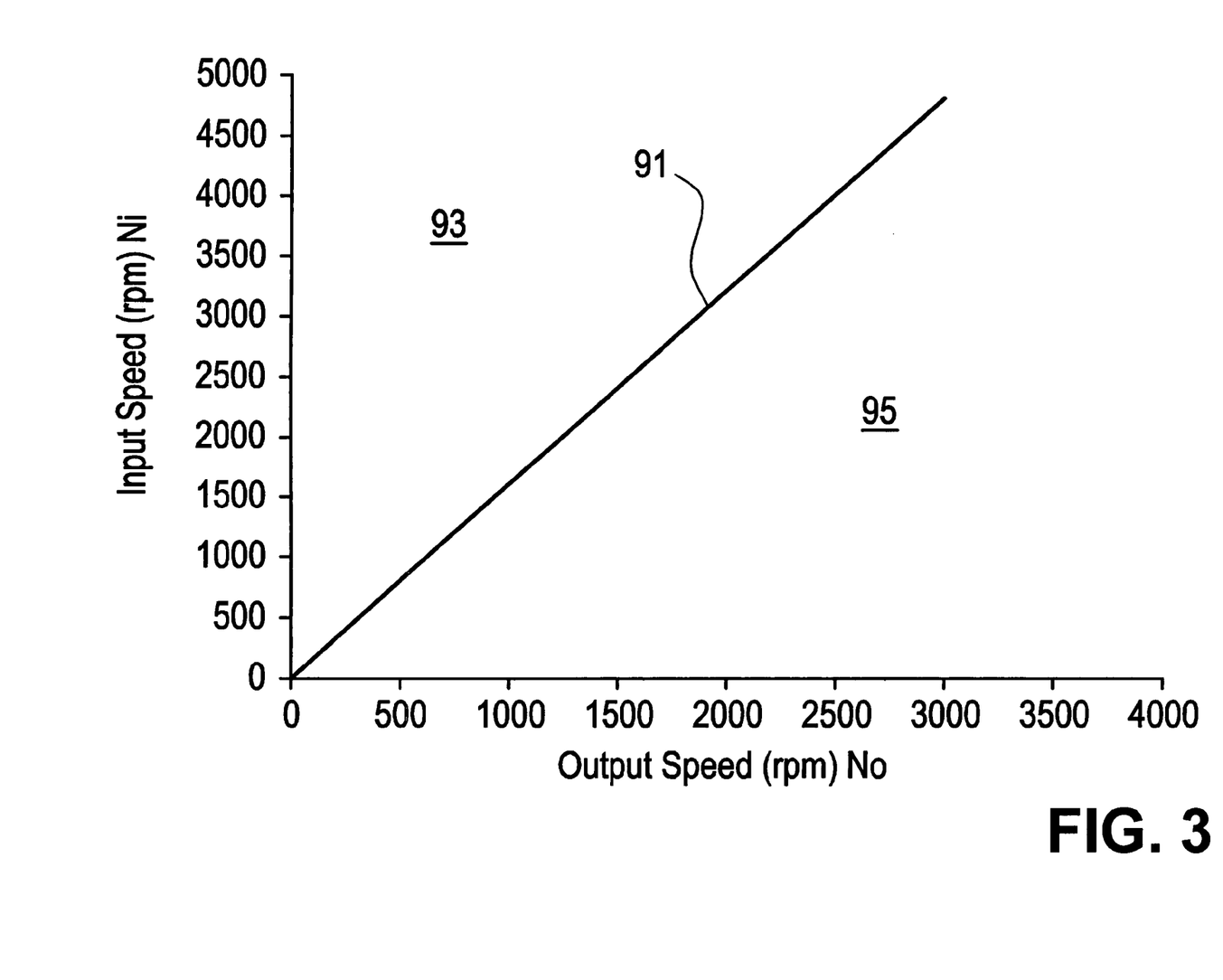
FIG. 3 is a graphical representation of various regions of operation with respect to input and output speeds of the exemplary electrically variable transmission disclosed herein.

With reference to FIG. 3, a plot of output speed No along the horizontal axis versus input speed Ni across the vertical axis for the EVT 10 is illustrated. Synchronous operation, that is the input speed and output speed relationships whereat both clutch C1 and C2 are operating simultaneously with substantially zero slip speed thereacross is represented by line 91. As such, it represents the input and output speed relationships substantially whereat synchronous shifting from between modes can occur or whereat direct mechanical coupling from input to output can be affected by simultaneous application of both clutches C1 and C2, also known as fixed-ratio. One particular gearset relationship capable of producing the synchronous operation depicted by line 91 in FIG. 3 is as follows: outer gear member 30 having 91 teeth, inner gear member 32 having 49 teeth, planet gear members 34 having 21 teeth; outer gear member 38 having 91 teeth, inner gear member 40 having 49 teeth, planet gear members 42 having 21 teeth; outer gear member 46 having 89 teeth, inner gear member 48 having 31 teeth, planet gear members 50 having 29 teeth. Line 91 may be variously referred to herein as synchronous line, shift ratio line or fixed-ratio line.

To the left of the shift ratio line 91 is a preferred region of operation 93 for the first mode wherein C1 is applied and C2 is released. To the right of the shift ratio line 91 is a preferred region of operation 95 for the second mode wherein C1 is released and C2 is applied. When used herein with respect to clutches C1 and C2, the term applied indicates substantial torque transfer capacity across the respective clutch while the term released indicates insubstantial torque transfer capacity across the respective clutch. Since it is generally preferred to cause shifts from one mode to the other to occur synchronously, torque transfers from one mode into the other mode are caused to occur through a two clutch application fixed ratio wherein, for a finite period prior to the release of the presently applied clutch, the presently released clutch is applied. And, the mode change is completed when fixed-ratio is exited by the continued application of the clutch associated with the mode being entered and the release of the clutch associated with the mode being exited. While region of operation 93 is generally preferred for the operation of the EVT in MODE 1, it is not meant to imply that MODE 2 operation of the EVT cannot or does not occur therein. Generally, however, it is preferred to operate in MODE 1 in region 93 because MODE 1 preferably employs gearsets and motor hardware particularly well suited in various aspects (e.g., mass, size, cost, inertial capabilities, etc.) to the high launch torques of region 93. Similarly, while region of operation 95 is generally preferred for the operation of the EVT in MODE 2, it is not meant to imply that MODE 1 operation of the EVT cannot or does not occur therein. Generally, however, it is preferred to operate in MODE 2 in region 95 because MODE 2 preferably employs gearsets and motor hardware particularly well suited in various aspects (e.g., mass, size, cost, inertial capabilities, etc.) to the high speeds of region 93. A shift into MODE 1 is considered a downshift and is associated with a higher gear ratio in accordance with the relationship of Ni/No. Likewise, a shift into MODE 2 is considered an upshift and is associated with a lower gear ratio in accordance with the relationship of Ni/No.

Figure 4:
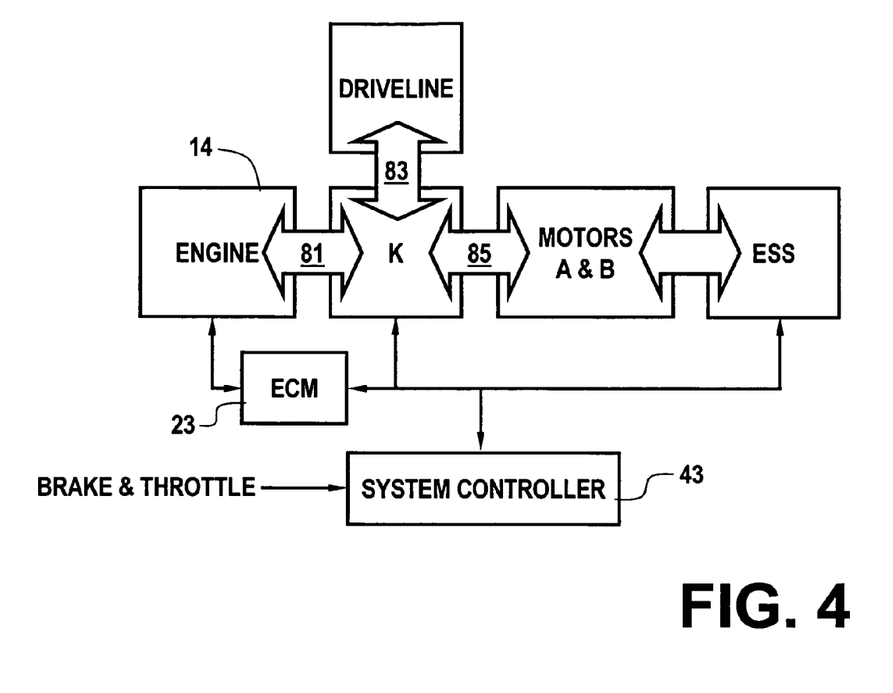
FIG. 4 is a simplified block diagram of a dual-motor, hybrid vehicle powertrain in accord with the present invention.

With reference now to FIG. 4, a more general block diagram of dual-motor, electrically-variable transmission powertrains heretofore described with respect to the particularly preferred embodiment of FIGS. 1-3 is illustrated. The powertrain includes an engine, a vehicle driveline and a pair of electric motors. The motors (identified as A and B), driveline and engine are operatively coupled to one another, for example, through a coupling means (K) comprising one or more planetary gearsets and selective coupling paths established in accordance with application and release of various torque transfer devices, e.g., clutches. The engine is coupled (81) to the coupling means at a mechanical input thereof. The driveline is coupled (83) to the coupling means at a mechanical output thereof. The motors are coupled (85) to the coupling means at various rotating members of the planetary gearsets. Neglecting power losses, the power flows between the engine, driveline and motors balance. And, the power at the driveline is equivalent to the summation of the powers at the engine and motors. Engine, driveline and motor torques follow the same relationships and are known through the various gearsets, power transmission components and the relationships therebetween as embodied in coupling constraint relationships. Speed relationships between the engine, driveline and motor are also known through the various gearsets, power transmission components and the relationships therebetween as embodied in coupling constraint relationships. The vehicle driveline may include such common driveline components as differential gearsets, propshafts, universal joints, final drive gearsets, wheels and tires. The electric motors receive electric power from and provide electric power to an energy storage system (ESS) which may take the form of one or more batteries in a battery pack module or any appropriate energy storage means capable of bidirectional electrical energy flow as previously described. Engine, driveline and motor torques may be in either direction. That is to say, each is capable of bidirectional torque contributions to the powertrain.

The ECM 23 is selectively operable to control the engine in either of a torque mode or a speed mode. Powertrain control has the general objective of meeting the operator torque request. Under normal system operation the control is preferably accomplished with selected engine torque and speed operating points in accordance with predetermined criteria, including system efficiency objectives. Engine torque control is handled by the engine controller in accordance with a commanded engine torque determined by the system controller, and engine speed control is handled by a speed control effected through the control of electric motor torque by the system controller and ESS controllers. Preferred methods for determining engine speed and engine torque and controlling engine speed are disclosed in commonly assigned and co-pending U.S. Ser. Nos. 10/686,511, 10/686,508, 10/686,034, and 10/799,531, which are all incorporated herein by reference. Under normal system operation, system controller 43 determines a desired output torque for use by the engine controller 23 in a torque control mode of engine operation. And, system controller 43 determines a desired input speed for use by the system controller to effect motor torques necessary to establish the input speed in accordance with the desired input speed. In response to certain anomalous motor operation, the powertrain controls may be adapted through provision of desired engine speed to the engine controller for use in a speed control mode of engine operation and control of the load torque at the transmission input through motor torque. Such an adaptation is disclosed in further detail in commonly assigned and co-pending U.S. Ser. No. 10/846,143, which is incorporated herein by reference.

In the EVT system thus described, a preferred control system effects various power splits among the electric machines and internal combustion engine to balance the various power flows within the system. As previously described, however, it is known that the batteries have limited amp-hour throughput that defines their useful service life. And, it is desirable to manage the useful life of the battery or battery pack. In the present invention therefore, certain battery power input and output limits are determined for the ESS such that the service life of the batteries is managed. The present invention is implemented to manage the useful service life of the battery, thereby extending the useful service life or enabling management of the ESS so that a predicted or established useful service life of the battery may be obtained. This is particularly advantageous in applications, such as buses or similar vehicles that are operated in fleets, wherein having a predictable service life of certain vehicle components such as the ESS is highly desirable. The invention is particularly useful for EVT HEVs of the types described above which incorporate electric machine(s) and a CVT(s) in a compound arrangement that require a sophisticated ESS in order to accommodate dynamic charge/discharge conditions in operation.

Battery charge and discharge power limits are established for use in effecting the management of useful life of the batteries. Power limits are influenced by a variety of considerations including battery SOC, battery temperature and amp-hour throughput. For example, battery power limit determination in accordance with such considerations is disclosed in commonly assigned and co-pending U.S. Ser. No. 10/686,180 which is incorporated herein by reference. Therein, for example, at low SOC values full charging of the ESS is indicated as desirable and charging limits are generous. However, the charging power limit is reduced as the battery approaches a full SOC. Power limits considering amp-hour throughput are similarly determined without respect to power flow direction since power in either direction functions to increase temperature and amp-hour throughput. The amp-hour throughput is determined in accordance with the techniques described herein.

Battery charge and discharge power limits thus established are applied to an EVT control system which uses the limits in establishing power contributions among the engine, driveline and motors. For example, a preferred EVT control is disclosed in commonly assigned and co-pending U.S. Ser. No. 10/799,531, which is incorporated herein by reference. Therein, a preferred input torque for a hybrid powertrain is determined within a solution space of feasible input torques in accordance with a plurality of powertrain system constraints including battery power limits in accordance with the amp-hour throughput determined in accordance with the techniques described herein. Battery power limits are, as previously described, correlated to various conditions, e.g., state of charge, temperature, voltage and usage (amp-hour/hour).

An amp-hour represents the amount of energy change in a battery that would allow one amp to flow into or out of the battery in one hour. Amp-hour throughput can be modeled as the integral of the magnitude of the battery current as shown in the equation below.

$$AH_{Throughput} = \int_0^t |I_{Bat}| dt \tag{1}$$

The useful operational life of a battery pack can be directly correlated with the amp-hours put into or taken out of the battery system. To maintain consistent vehicle performance while regulating the amp-hour throughput of the battery system, two representations of the battery current are determined. The two representations are of a moving average of the battery current with different averaging windows. A long term window and a short term window are employed. The long term window is selected to limit the amp-hour throughput to the desired long term level to provide the desired battery life. The short term average is used to limit short term extremely high amp-hour maneuvers without enforcing too restrictive battery power limits as a period of low amp-hour usage is expected to follow.

A generalized representation of a moving average would take the form set forth below in the following relationship.

$$y_k = \frac{1}{n} \sum_{i=0}^{n} u_{k-i} \tag{2}$$

And a generalized representation of a digital low pass filter can be expressed as set forth below in the following relationship.

$$y_k = A \sum_{i=0}^{k-1} (1-A)^i u_{k-i} \tag{3}$$

From the above two relationships it can be appreciated that with proper selection of the constant A, the low pass filter can be adapted to provide a moving average with a different weighting factor on each element in the average. Such a first order digital low pass filter is preferably used to calculate a weighted moving average of the battery current. The elemental weighting function decreases such that more recent values are weighted more heavily than values from the past.

Looking at the calculation in the continuous time domain, a true integrator would have the transfer function set forth below in the following relationship.

$$H(s) = \frac{1}{s} \tag{4}$$

And a low pass filter would have the transfer function set forth below in the following relationship.

$$H(s) = \frac{\tau}{s + \tau} \tag{5}$$

The latter transfer function results in an integrated value that weighs the more recent value more heavily and does not count values in the past as heavily.

Therefore, it is preferable that a low pass digital filter provides a representation of the average battery current. By applying such filter to the absolute value of the battery current, charging and discharge current can be included equally in the resultant average. This average current then represents the amp-hour throughput of the battery system.

Thus, the output of the filter represents the amp-hour throughput per hour of the battery system. Given the total amp-hour throughput for the life of the battery system, and the desired operating life of the pack in hours, an allowable amp-hour budget that can be used on an hourly basis can be determined by dividing the amp-hour throughput for the life of the battery system by the desired operating life of the pack. This then becomes a key parameter in managing the life of the battery pack.

Figure 5:
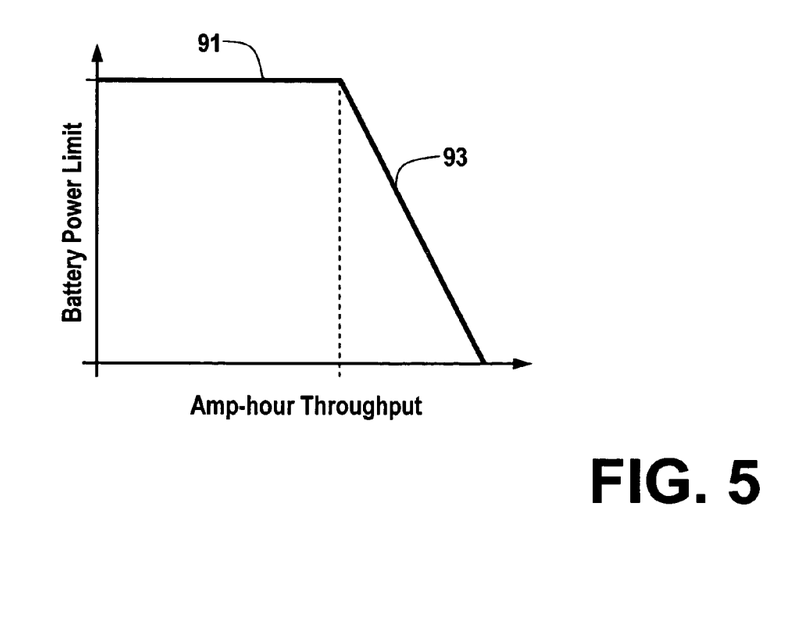
FIG. 5 is a graphical representation of vehicle calibration data useful in the determination of battery power limits as a function of amp-hour throughput in accordance with the present invention.

Once the amp-hour throughput of the battery is calculated, battery power limits required to effect the allowable or budgeted amp-hour throughput are determined. Preferably, calibrated look-up table data is referenced for this purpose as exemplified in the illustration of FIG. 5 which shows the general characteristics of such a data set. In FIG. 5, the calculated amp-hour throughput is used in referencing battery power limits. At smaller, less significant throughputs there is effectively no attenuated limit on battery power—that is to say the limit associated with the amp-hour throughput is simply the power capability of the battery system (91). As the amp-hour throughput increases and approaches the amp-hour budget, the battery power limit will be increasingly attenuated (93). The increasingly tighter power limits effectively result in limitations on the amp-hour throughput and will effect trending of the average amp-hour throughput to below the amp-hour budget. Therefore, the control system utilizing the battery power limits so derived manages the amp-hour throughput for the battery pack to effect the desired service life of the battery pack.

Figure 6:
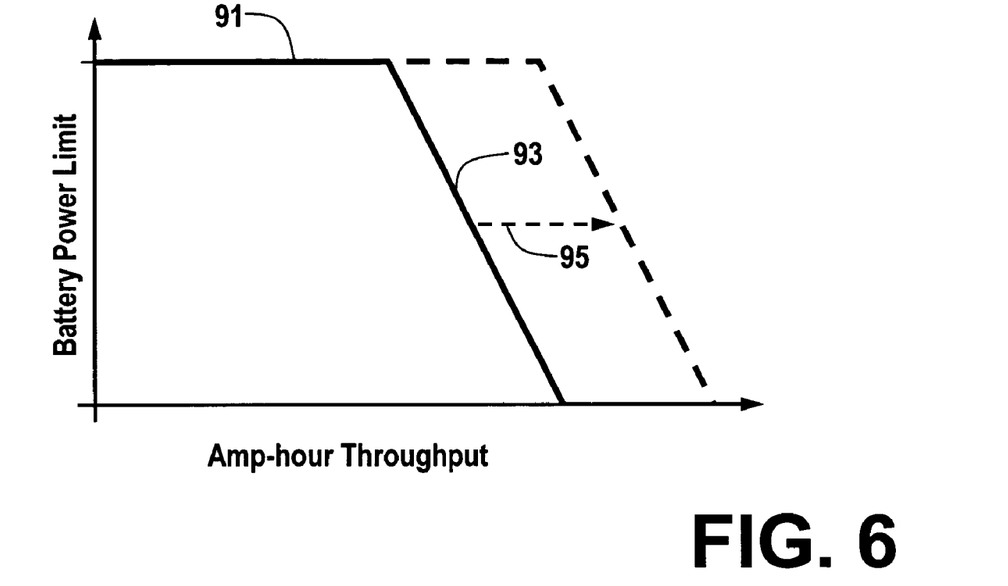
FIG. 6 is a graphical representation of vehicle calibration data useful in the determination of battery power limits as a function of amp-hour throughput as shown in FIG. 5 and further corresponding to a general offset manipulation in accordance with the present invention.

In cases of high battery SOC, it may be more desirable to bias the battery system toward power discharge than toward the amp-hours budgeted to avoid a more imminent undesirable consequence upon the battery. One manner of accomplishing this objective is to effectively offset the look-up table data such that additional battery power is made available for discharging. FIG. 6 illustrates such an offset shift (95) of the look-up table data. In this way, the system is not constrained by the amp-hour budget from reducing the battery SOC away from an undesirable region toward a more desirable, less fully charged, region. And the battery current integration used in the determination of the amp-hour throughput continues to operate during such periods when the battery SOC benefits from extending the battery discharge power limits. Therefore, when the SOC no longer requires the extended battery discharge power limits, the amp-hour throughput would have integrated to a larger value consistent with the battery discharge power limit extension. Thus, the new battery power limits will be more constrained than they otherwise would have been absent the extended battery utilization above the normal limits. Beneficially, this also serves to manage the overall, long-term amp-hour throughput to remain within the budget even in spite of a period of high SOC extended battery discharge power limits since such a period will be followed by more heavily attenuated power limits.

Similarly, as with the discharge power limits, the amp-hour throughput and budget are also used to determine battery charging power limits. First, in the case of charging, several such potential offsets may be implemented in arriving at the charging power limit. If the vehicle is in propulsion mode a charging specific offset is applied to the amp-hour value, whereas if the vehicle is in regeneration a regeneration specific offset is applied. The charging offset is used to bias the battery system toward charging to maintain the desired SOC if required. The regeneration offset is used to bias the battery system toward absorbing additional regeneration energy without undesirably limiting the acceptance of this energy. Any energy generated in regeneration and not stored in the batteries would be dissipated in the vehicle service braking system. Given the temporal nature of the braking events relative to the overall battery pack useful life, it is generally more desirable to recapture the braking energy in lieu of limiting the amp-hour throughput strictly in accordance with the amp-hour budget and normal power limits established in accordance therewith. Therefore, an effective offset to the look-up table data allows the battery system to recapture additional energy that otherwise would be dissipated thereby improving the overall efficiency of the vehicle without significant negative impact upon the useful life of the battery pack. In cases of extremely low SOC, it may be more desirable to bias the battery system toward power charge than toward the amp-hours budgeted to avoid a more imminent undesirable consequence upon the battery. One manner of accomplishing this objective is to effectively offset the look-up table data such that additional battery power is made available for charging. In this way, the system is not constrained by the amp-hour budget from increasing the battery SOC away from an undesirable region toward a more desirable, more fully charged, region. And as similarly described with respect to high SOC extended battery discharge power limits herein above, the battery current integration used in the determination of the amp-hour throughput continues to operate during such periods when the battery SOC benefits from extending the battery charge power limits. Therefore, when the SOC no longer requires the extended battery charge power limits, the amp-hour throughput would have integrated to a larger value consistent with the battery charge power limit extension. Thus, the new battery power limits will be more constrained than they otherwise would have been absent the extended battery utilization above the normal limits. Beneficially, this also serves to manage the overall, long-term amp-hour throughput to remain within the budget even in spite of a period of low SOC extended battery charge power limits since such a period will be followed by more heavily attenuated power limits.

Figure 7:
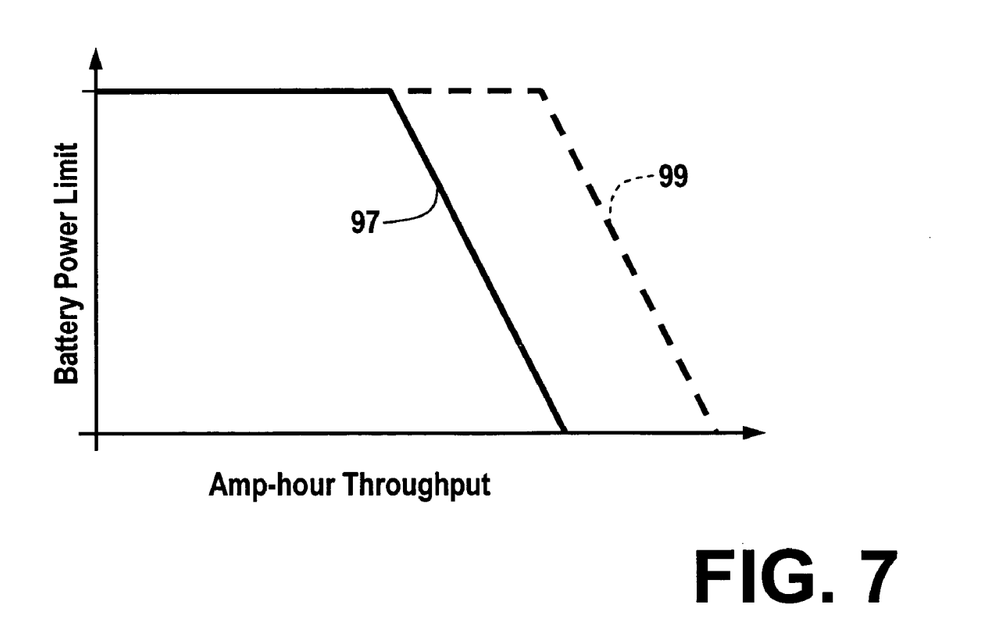
FIG. 7 is a graphical representation of vehicle calibration data useful in the determination of battery power limits as a function of amp-hour throughput as shown in FIG. 5 and further corresponding to both long and short term amp-hour throughput determinations in accordance with the present invention.

Preferably, as previously mentioned, short and long term average amp-hour throughput calculations are performed using varied filtering windows. And each such amp-hour throughput is utilized in the determination of respective battery power limits as described. Generally, the long term window is selected to limit the amp-hour throughput to the desired long term level to provide the desired battery life. The short term average is used to limit short term extremely high amp-hour maneuvers without enforcing too restrictive battery power limits as a period of low amp-hour usage is expected to follow. The most restrictive battery power limit values are then selected for use by the remainder of the control system as previously described. FIG. 7 illustrates exemplary battery power limit data returned for long and short term amp-hour throughputs, 97 and 99 respectively. In the illustrated example, the long term limit would be selected as it is more restrictive on battery power usage than the short term limit.

While the invention has been described by reference to certain preferred embodiments and implementations, it should be understood that numerous changes could be made within the spirit and scope of the inventive concepts described. Accordingly, it is intended that the invention not be limited to the disclosed embodiments, but that it have the full scope permitted by the language of the following claims.

The invention claimed is:

1. Method for limiting battery power comprising:
providing an amp-hour threshold;
monitoring amp-hour throughput;
determining a moving average amp-hour throughput from said monitored amp-hour throughput;
when the moving average amp-hour throughput exceeds said amp-hour threshold, establishing a battery power limit as a function of the moving average amp-hour throughput; and
limiting battery power in accordance with said established battery power limit.

2. Method for limiting battery power as claimed in claim 1 wherein determining said moving average amp-hour throughput includes low pass filtering said monitored amp-hour throughput.

3. The method for limiting battery power as claimed in claim 1 wherein establishing said battery power limit comprises providing an increasingly tighter battery power limit as the moving average amp-hour throughput increasingly exceeds said amp-hour threshold.

4. The method for limiting battery power as claimed in claim 3 wherein said amp-hour threshold is effectively increased for battery discharge current during a high battery state of charge to effect a bias toward battery discharging.

5. The method for limiting battery power as claimed in claim 3 wherein said amp-hour threshold is effectively increased for battery charge current during a low battery state of charge to effect a bias toward battery charging.

6. The method for limiting battery power as claimed in claim 3 wherein said method is implemented in a vehicle operative with regenerative braking and said amp-hour threshold is effectively increased for battery charge current during a regenerative braking event to effect a bias toward battery charging.

7. Method for establishing limits on battery power, comprising: determining battery throughput as a moving average of amp-hour throughput; comparing said battery throughput to a predetermined amp-hour threshold related to a battery life target; and when the battery throughput exceeds said amp-hour threshold, providing a battery power limit as a function of amp-hour throughput effective to reduce the battery throughput.

8. The method for establishing limits on battery power as claimed in claim 7 wherein determining battery throughput as calculating a moving average of amp hour throughput comprises low pass filtering battery current magnitude using heavier weighting of more recent current magnitudes.

9. The method for establishing limits on battery power as claimed in claim 7 wherein said battery life target comprises a predetermined amount of operating time and said predetermined amp hour threshold corresponds to a battery throughput budget which if adhered to will result in battery life at least to said battery life target.

10. The method for establishing limits on battery power as claimed in claim 7 wherein providing a battery power limit comprises providing an increasingly tighter battery power limit as the battery throughput increasingly exceeds said amp hour threshold.

11. The method for establishing limits on battery power as claimed in claim 10 wherein said amp hour threshold is effectively increased for battery discharge current during a high battery state of charge to effect a bias toward battery discharging.

12. The method for establishing limits on battery power as claimed in claim 10 wherein said amp hour threshold is effectively increased for battery charge current during a low battery state of charge to effect a bias toward battery charging.

13. The method for establishing limits on battery power as claimed in claim 10 wherein said method is implemented in a vehicle operative with regenerative braking and said amp-hour threshold is effectively increased for battery charge current during a regenerative braking event to effect a bias toward battery charging.

\* \* \* \* \*